United States Patent
Rudeck et al.

(10) Patent No.: US 6,756,268 B2
(45) Date of Patent: Jun. 29, 2004

(54) MODIFIED SOURCE/DRAIN RE-OXIDATION METHOD AND SYSTEM

(75) Inventors: Paul J. Rudeck, Boise, ID (US); Francis Benistant, Boise, ID (US); Kelly Hurley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/143,450

(22) Filed: May 10, 2002

(65) Prior Publication Data

US 2002/0132427 A1 Sep. 19, 2002

Related U.S. Application Data

(62) Division of application No. 09/769,162, filed on Jan. 24, 2001.

(51) Int. Cl.[7] ............................................ H01L 21/336
(52) U.S. Cl. ................... 438/257; 438/201; 438/211; 438/263; 438/264
(58) Field of Search .............................. 438/211, 257, 438/264, 263, 201

(56) References Cited

U.S. PATENT DOCUMENTS

| | | | | |
|---|---|---|---|---|
| 5,210,047 A | * | 5/1993 | Woo et al. ................. 438/257 |
| 5,278,087 A | * | 1/1994 | Jenq ........................... 438/594 |
| 5,298,447 A | | 3/1994 | Hong | |
| 5,397,724 A | * | 3/1995 | Nakajima et al. ........... 438/257 |
| 5,464,782 A | * | 11/1995 | Koh ........................... 438/303 |
| 5,596,213 A | | 1/1997 | Lee | |
| 5,652,152 A | * | 7/1997 | Pan et al. .................... 438/280 |
| 5,726,470 A | | 3/1998 | Sato | |
| 5,763,309 A | | 6/1998 | Chang | |
| 5,851,881 A | | 12/1998 | Lin et al. | |
| 5,874,759 A | | 2/1999 | Park | |
| 5,885,877 A | * | 3/1999 | Gardner et al. ............. 438/300 |
| 6,033,954 A | | 3/2000 | Park | |
| 6,235,581 B1 | | 5/2001 | Chen | |
| 6,303,959 B1 | * | 10/2001 | Ratnam ....................... 257/314 |
| 6,661,057 B1 | * | 12/2003 | Dawson et al. ............. 257/336 |

* cited by examiner

Primary Examiner—Matthew Smith
Assistant Examiner—Chuong Anh Luu
(74) Attorney, Agent, or Firm—Dinsmore & Shohl LLP

(57) ABSTRACT

Methods and devices are disclosed utilizing a phosphorous-doped oxide layer that is added prior to re-oxidation. This allows greater control of the re-oxidation process and greater control of the performance characteristics of semiconductor devices such as flash memory. For flash memory, greater control is gained over programming rates, erase rates, data retention and self align source resistance.

35 Claims, 8 Drawing Sheets

MODIFIED SOURCE/DRAIN RE-OXIDATION METHOD AND SYSTEM

CROSS REFERENCE TO RELATED APPLICATIONS

This application is a second division of U.S. patent application Ser. No. 09/769,162 filed Jan. 24, 2001.

BACKGROUND OF THE INVENTION

The present invention relates to the field of semiconductor manufacture and, more particularly, to a modified source/drain re-oxidation process.

As computers become increasingly complex, the need for memory storage, and in particular the number of memory cells, increases. At the same time, there is the need to minimize the size of computers and memory devices. A goal of memory device fabrication is to increase the number of memory cells per unit area or wafer area.

Memory devices contain blocks or arrays of memory cells. A memory cell stores one bit of information. Bits are commonly represented by the binary digits 0 and 1. A conventional non-volatile semiconductor memory device in which contents can be electrically programmable or simultaneously erased by one operation is a flash memory device.

Flash memory devices have the characteristics of low power and fast operation making them ideal for portable devices. Flash memory is commonly used in portable devices such as laptop or notebook computers, digital audio players and personal digital assistant (PDA) devices.

In flash memory, a charged floating gate is zero logic state, typically represented by the binary digit 0, while a non-charged floating gate is the opposite logic state typically represented by the binary digit 1. Charges are injected or written to a floating gate by any number of methods, including avalanche injection, channel injection, Fowler-Nordheim tunneling, and channel hot electron injection, for example.

The key performance parameters of a flash memory cell are programming rates, erase rates, and data retention. These parameters are a strong function of the post source drain re-oxidation gate edge profile. This profile is also referred to as a reox smile. During source drain re-oxidation, the thickness of the tunnel oxide and oxide-nitride-oxide (ONO) layers are increased along the exposed edge of the gate electrodes. The profile of this thickness enhancement plays a major role in the performance of a flash memory cell. As the thickness of this profile increases, reliability and data retention increases while erase rates or speeds worsen. Thus, it is desirable to accurately control the thickness of this profile. However, there are only limited ways to modify this profile. A common way to attempt to modify the profile is controlling the conditions of the re-oxidation. The conditions controlled are source and drain doping concentration profiles before oxidation. However, this approach is limited.

Enhancing the ability to control this source drain re-oxidation gate edge profile is desirable.

SUMMARY OF THE INVENTION

A method that can be used to modify the smile profile during the fabrication of semiconductor devices, such as flash memory, is disclosed. A memory cell structure is defined on a substrate. A layer of phosphorous-doped oxide is deposited over substrate. Horizontal surfaces of the layer of phosphorous-doped oxide are selectively removed while vertical surfaces of the phosphorous-doped oxide remain. The horizontal surfaces are substantially planar to the substrate surface. The vertical surfaces are substantially perpendicular to the substrate surface.

A method for fabricating a flash memory cell is disclosed. A self align source is formed on a substrate. A drain is formed on the substrate. A layer of phosphorous-doped oxide is deposited on the substrate. Portions of the phosphorous-doped oxide layer are removed leaving remaining portions of the phosphorous-doped oxide layer. Standard re-oxidation is performed on the substrate.

A semiconductor device is disclosed. The semiconductor device includes a substrate, a drain, a self aligned source, a first oxide layer, a first polysilicon layer, a second dielectric layer, a second polysilicon layer and a phosphorous doped oxide layer. The drain is formed in the substrate. The self align source is formed in the substrate. The first oxide layer is deposited in the substrate from the drain to the self align source. The first polysilicon layer is deposited over the first oxide layer. The second dielectric layer is deposited over the first polysilicon layer. The second polysilicon layer is deposited over the second oxide layer. A phosphorous-doped oxide layer is located only along edges of the first oxide layer, the first polysilicon layer, the second oxide layer and the second polysilicon layer.

Other methods and devices are disclosed.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

DETAILED DESCRIPTION OF THE INVENTION

For the purposes of describing and defining the present invention, formation of a material "on" a substrate or layer refers to formation in contact with a surface of the substrate or layer. Formation "over" a substrate or layer refers to formation above or in contact with a surface of the substrate. Formation "in" a substrate or layer refers to formation of at least a portion of a structure in the interior of a substrate or layer. A "wafer" is a thin, usually round slice of semiconductor material, such as silicon, from which chips are made. A "substrate" is the underlying material upon which a device, circuit, or epitaxial layer is fabricated. A "flash memory device" includes a plurality of memory cells. Each "memory cell" of a flash memory device can comprise components such as a gate, floating gate, control gate, wordline, channel region, a source, self aligned source and a drain. A self align source (SAS) is a semiconductor structure that allows a number of cells to share a common source or source junction. An "anneal" is a high temperature processing step designed to minimize stress in the crystal structure of the wafer. The term "patterning" refers to one or more steps that result in the removal of selected portions of layers. The patterning process is also known by the names photomasking, masking, photolithography and microlithography.

Figure 1:
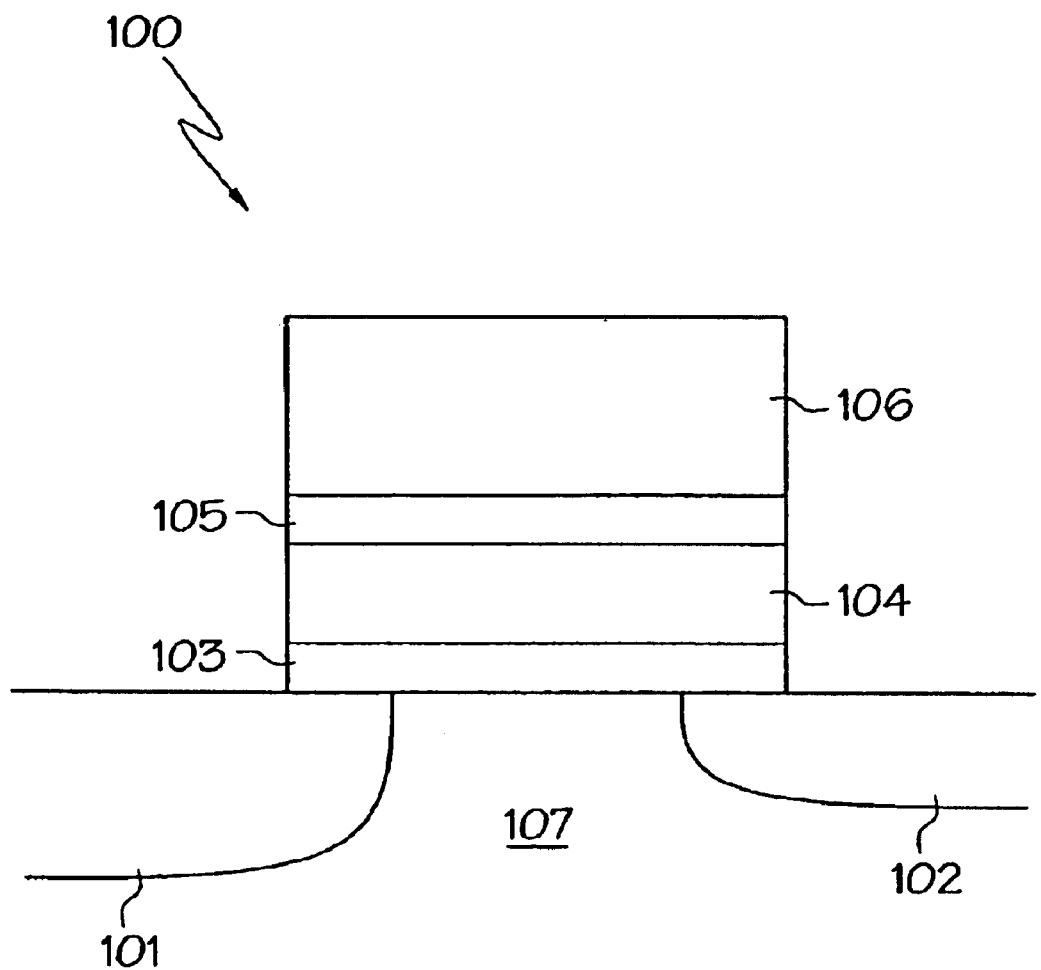
FIG. 1 illustrates a semiconductor device for flash memory.

FIG. 1 illustrates a semiconductor device 100 for flash memory. FIG. 1 is prior art. The device 100 includes a substrate 107, a source 101, a drain 102, a tunnel oxide 103, a first polysilicon (poly) layer 104, a dielectric layer 105 and a second poly layer 106.

The substrate 107 is typically comprised of silicon. The source 101 and drain 102 are formed in the substrate 107 by doping. The source 101 can be created by doping with As (arsenic) and P (phosphor), individually or in combination. The drain 102 can be formed by doping with As. The tunnel oxide layer 103 is formed as shown in FIG. 1 and stretches from the source 101 to the drain 102. The first poly layer 104 is formed over the tunnel oxide layer 103. The first poly layer is typically a floating gate. The first poly layer 104 is typically lightly doped. The dielectric layer 105 is formed over the first poly layer 104. It can be composed of a dielectric such as oxide nitride oxide (ONO). The second poly layer 106 is formed over the dielectric layer 105. The second poly layer 106 can be comprised of any suitable conductor, but it typically is a poly with a metal silicide. The second poly layer 106 can be a wordline.

Figure 2A:
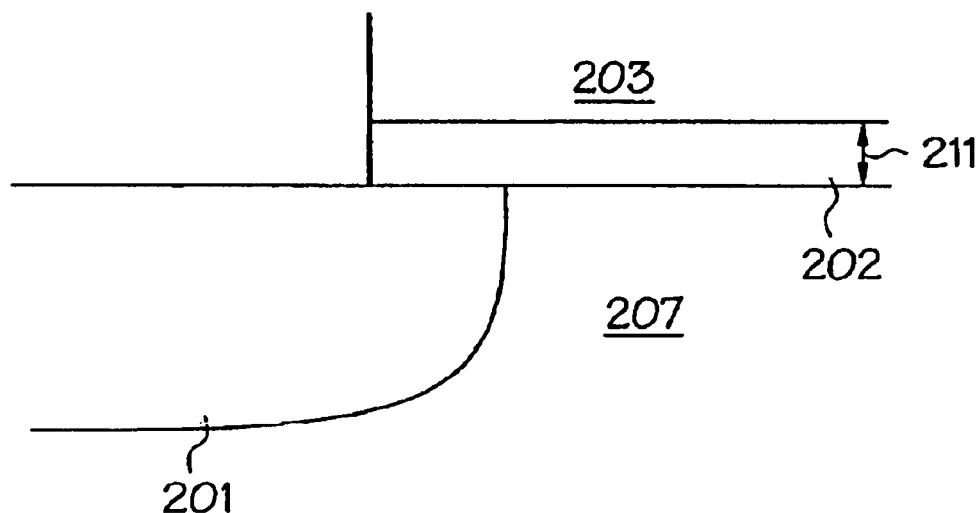
FIG. 2A illustrates a semiconductor device prior to re-oxidation.

FIG. 2A illustrates a portion of a semiconductor device prior to re-oxidation. FIG. 2A is prior art. A source 201 has already been formed by doping a semiconductor 207. A tunnel oxide layer 202 has been formed over the surface of the semiconductor 207 and a floating gate poly layer 203 has been formed over the tunnel oxide layer. The tunnel oxide layer 202 is formed to a specific thickness or original thickness 211.

Figure 2B:
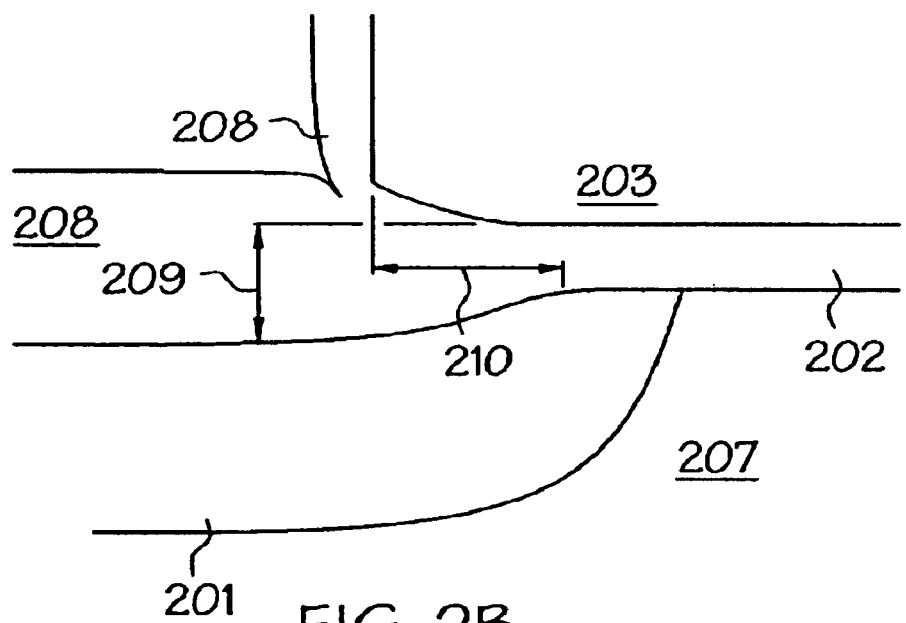
FIG. 2B illustrates a semiconductor device after re-oxidation.

FIG. 2B illustrates the portion of the semiconductor device after re-oxidation. FIG. 2B is prior art. A re-oxidation oxide profile 208 has formed as shown in FIG. 2B over surfaces of the device. The re-oxidation oxide profile 208 has two important characteristics or parameters, height 209 and width 210. The height 209 is the vertical distance from the top of the source 201 (silicon surface) to the bottom edge of the floating gate poly layer 203 as shown in FIG. 2B. The width 210 is the horizontal distance from the edge of the floating gate poly layer 203 to the point where the tunnel oxide starts getting thicker than the original thickness 211 and the thickness of the rest of the channel region. The height 209 and width 210 parameters have a large effect on the operation of the flash memory device. As the height 209 increases, the reliability of the flash memory device increases but erase speed decreases. As the width 210 increases, erase speed decreases. However, with standard re-oxidation techniques, it is difficult to control these parameters, 209 and 210, and the re-oxidation profile 208.

Figure 3A:
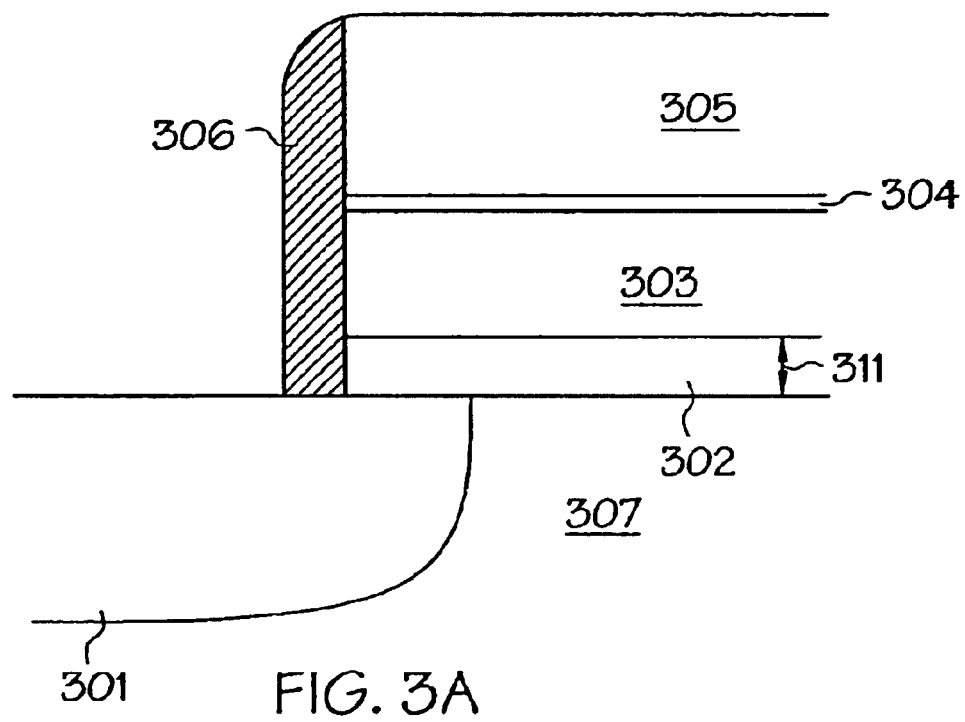
FIG. 3A illustrates a portion of a semiconductor device according to one embodiment of the invention.

FIG. 3A illustrates a portion of a semiconductor device according to one embodiment of the invention. The portion of the semiconductor device includes a source 301 formed in a semiconductor 307. A tunnel oxide layer 302 is formed over the surface of the semiconductor 307 and the surface of the source 301 as shown in FIG. 3A. The floating gate poly layer 303 is formed over the tunnel oxide layer 302. An ONO layer 304 is formed over the floating gate poly layer 303. Another poly layer or wordline poly layer 305 is formed over the ONO layer 304. The phosphorous doped oxide has been formed over all surfaces of the semiconductor and removed from all substantially horizontal surfaces so that the remaining phosphorous doped oxide 306 is only on substantially vertical surfaces such as is shown in FIG. 3A. The phosphorous-doped oxide can be formed over the semiconductor by using methods such as chemical vapor deposition or spin on glass (SOG). Using the SOG method could create higher dopant concentrations. The phosphorous-doped oxide can be removed from substantially horizontal surfaces by etching such as, for example, an anisotropic etch.

Figure 3B:
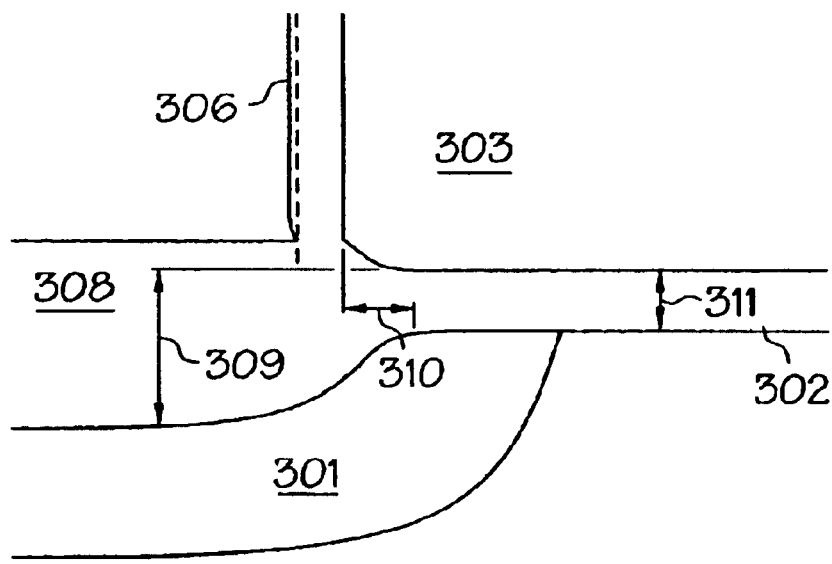
FIG. 3B illustrates the portion of the semiconductor device after re-oxidation according to one embodiment of the invention.

FIG. 3B illustrates the portion of the semiconductor device after re-oxidation according to one embodiment of the invention. A re-oxidation oxide profile 308 has formed as shown in FIG. 3B over surfaces of the device. The re-oxidation oxide profile 308 has two important characteristics or parameters, height 309 and width 310. The height 309 is the vertical distance from the top of the source 301 (silicon surface) to the bottom edge of the floating gate poly layer 303 as shown in FIG. 3B. The width 310 is the horizontal distance from the edge of the floating gate poly layer 303 to the point where the tunnel oxide layer 302 starts getting thicker than the original thickness 311 and the thickness of the rest of the channel region. The height 309 and width 310 parameters have a large effect on the operation of the flash memory device. As the height 309 increases, the reliability of the flash memory device increases but erase speed decreases. As the width 310 increases, erase speed decreases. However, with standard re-oxidation techniques, it is difficult to tailor these parameters, 309 and 310, and the re-oxidation profile 308. By having utilized the phosphor doped oxide 306, the height 309 is similar to the height of the device of FIGS. 2A–2C but, the width is significantly less than the width of the device in FIGS. 2A–2C. Thus, the data retention of the device in FIG. 3 will be similar to the data retention of the device in FIG. 2, but the erase speed of the semiconductor device of FIG. 3 is likely significantly better than the device of FIG. 2. An additional benefit is that the resistance of the source rail or common source may be lowered.

Figure 4A:
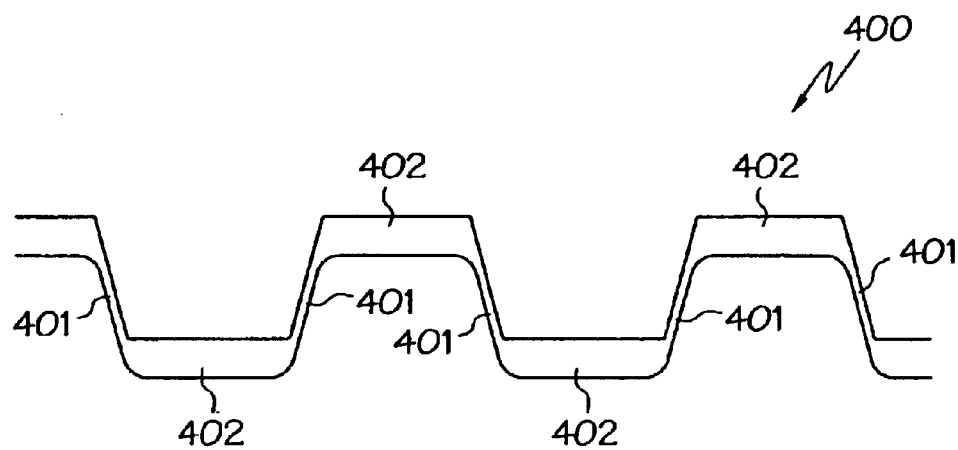
FIG. 4A illustrates standard self aligned source doping after source implant and re-oxidation.

FIG. 4A illustrates standard self aligned source 400 doping after source implant and re-oxidation. FIG. 4A is prior art. The source doping takes place at 403. The horizontal surfaces 402 are heavily doped and the vertical surfaces 401 are lightly doped. The resistance of the self align source 400 is a function of the dopant atom concentration of along it. Because of steep profiles formed during shallow trench isolation processes, the concentration of dopant atoms along the self align source is not uniform. Atoms implanted in the steep slope or vertical surfaces 401 have a lower effective concentration due to the nature of the implant process. This decrease in concentration along the vertical surfaces 401 of the self align source, leads to higher than expected self aligned source resistance. This problem increases as the depth of the shallow trench increases and this is one of the limiting factors for increasing the trench depth.

Figure 4B:
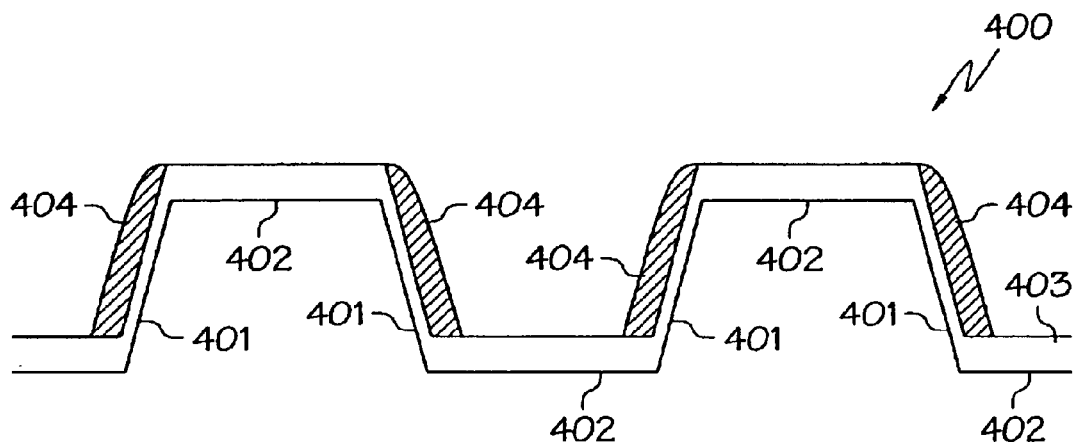
FIG. 4B illustrates self align source doping according to one embodiment of the invention.
Figure 4C:
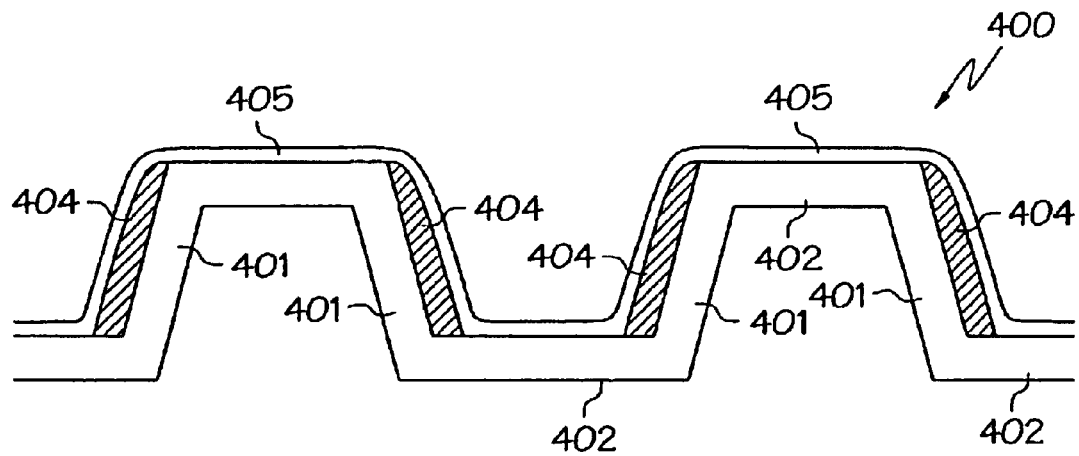
FIG. 4C illustrates self align source doping according to one embodiment of the invention.

FIG. 4B illustrates self align source 400 doping according to one embodiment of the invention. FIG. 4B is prior to re-oxidation and after source implants 403 and phosphorous doped oxidation 404 and etching. Phosphorous doped oxide has been removed from the horizontal surfaces 402 so that the phosphorous doped oxide 404 only remains on the vertical surfaces 401. FIG. 4C illustrates self align source 400 doping according to one embodiment of the invention. FIG. 4C is the self align source of FIG. 4B after re-oxidation. The vertical surfaces 401 have increased doping from phosphorus diffusing out of the phosphorous doped oxide 404. Thus, the vertical surfaces 401 and horizontal surfaces 402 are more evenly doped than the respective surfaces of FIG. 4A. Furthermore, by supplying an additional source of dopant directly to the vertical surfaces 401, the overall self align source resistance can be improved. The rail resistance-limiting factor for trench depth can be greatly reduced or eliminated. Additionally, the phosphorous doped oxide prevents out-diffusion of phosphorus from regions which are covered by the phosphorous doped oxide 405 during high temperature thermal cycling that follows. The re-oxidation oxide 405 is formed over the phosphorous doped oxide 404 and horizontal surfaces 402.

Figure 5:
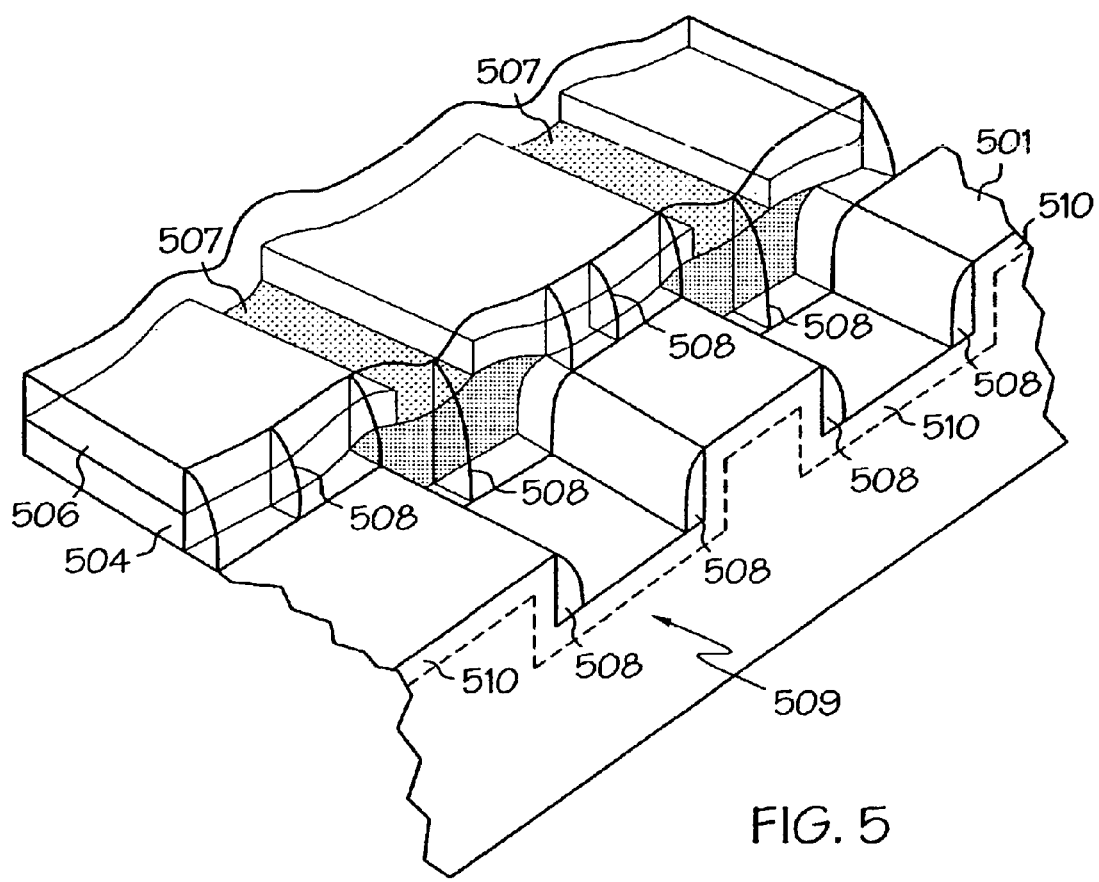
FIG. 5 illustrates a flash memory device according to one embodiment of the invention.

FIG. 5 illustrates a flash memory device according to one embodiment of the invention. The device is fabricated on a silicon substrate 509. The self align source 501 is formed in the silicon substrate 509. The floating gate layer 504 is formed over the substrate 509. The floating gate layer 504 typically has a tunnel oxide layer between itself and the substrate 509, but the tunnel oxide layer cannot be seen in FIG. 5. An ONO layer is formed over the floating gate layer 504 but is not visible in FIG. 5. A wordline poly layer 506 is formed under the ONO layer. Field isolation oxide 507 is formed over the wordline poly layer 506. Phosphorous-doped oxide 508 is formed on steep or substantially vertical surfaces. An example of forming the phosphorous-doped oxide 508 is to use chemical vapor deposition.

The phosphorous-doped oxide 508 is able to modify the source drain re-oxidation process three ways. First, it can act as a dopant source which allows for adjusting the doping concentration profile 510 from the edge inward for the floating gate poly 504 and from the surface downward for the silicon substrate 509. Secondly, the phosphorous doped oxide 508 acts as a barrier against phosphorus out-diffusion during high temperature processing. High temperature processing normally occurs during re-oxidation. Third, the phosphorous doped oxide acts as a barrier against the diffusion of oxygen during re-oxidation processes which reduce the lateral oxide encroachment under the floating gate layer 504.

The oxidation rate of silicon and poly-silicon is dependent on the type and concentration of the dopant atoms. Generally, the higher the concentration, the higher the oxidation rate. Additionally, the oxidation rate is dependent on the ability of oxygen and silicon to react. The greater the distance that these atoms need to diffuse, the lower the oxidation rate. By utilizing the phosphorous-doped oxide, the concentration profile, edge to center for the floating gate poly can be adjusted and the oxidation rate can be reduced.

The key characteristics of the phosphorous-doped oxide are thickness and phosphor concentration. Some acceptable ranges for thickness is 25 Å to 500 Å and the phosphorous concentration is 1% to 6%. The range of thickness and phosphor concentrations affect the programming rate, erase rate and data retention by assisting (concentration) or reducing(thickness) the oxidation rate in the smile region. Other dopants besides phosphor can be used in the doped oxide.

Figure 6:
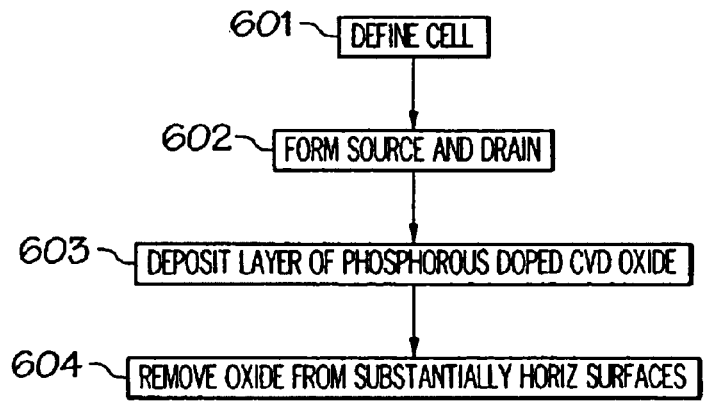
FIG. 6 illustrates a method according to one embodiment of the invention.

FIG. 6 illustrates a method according to one embodiment of the invention. A memory cell structure is defined on a substrate at block 601. The memory cell structure can be all or part of a memory cell. The memory cell structure can define the dimensions and locations of the memory cell and its components, such as source and drain, on the substrate. A source and drain are formed in a semiconductor at block 602. The source can be a self align source. A layer of phosphorous-doped oxide is deposited over the semiconductor at 603. Generally, the phosphorous-doped oxide is deposited over the semiconductor using chemical vapor deposition. The phosphorous-doped oxide is removed from substantially horizontal surfaces at 604 so that the oxide only remains on substantially vertical surfaces. Normal re-oxidation is performed to finish fabricating the memory cell.

Figure 7:
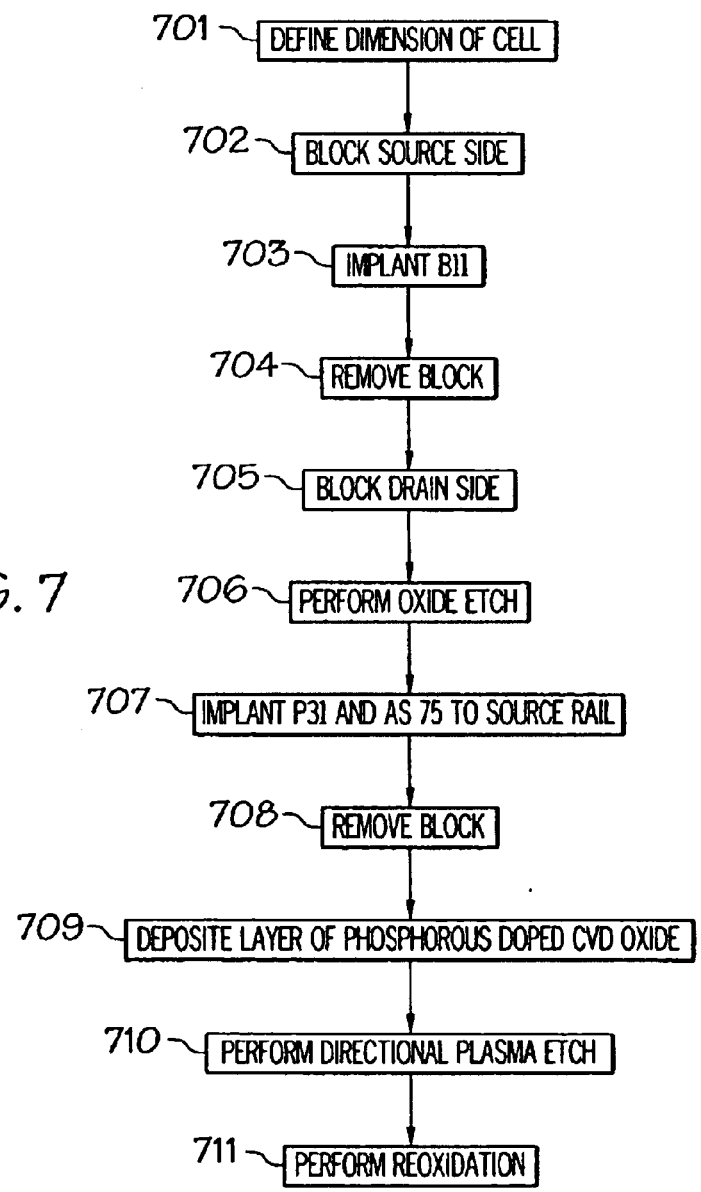
FIG. 7 illustrates a method according to one embodiment of the invention.

FIG. 7 illustrates a method of fabricating a flash memory cell according to one embodiment of the invention. The dimensions of the flash memory cell are defined at block 701 on a substrate. The source side of the flash cell is blocked at 702. The drain side is implanted with boron-11 at 703. The block is then removed from the source side at block 704. The drain side is blocked at 705. An oxide dry etch is performed in order to remove isolation oxide along a self align source at block 706. The source is implanted with phosphor-31 and arsenic-75 in order to dope the self align source 707. The block is removed from the drain side at 708. A layer of phosphorous-doped oxide is deposited over the flash memory cell at block 709. The thickness of the phosphorous doped oxide and the phosphor concentration of the phosphorous doped oxide are selected to achieve desired characteristics of the flash memory cell, such as program rate, erase rate and data retention. For illustrative purposes, some typical thickness and phosphor concentrations are 25 Å to 500 Å and 1% to 6%. A directional plasma etch is performed to remove phosphorous doped oxide from horizontal surfaces at 710. The directional plasma etch selectively leaves the phosphorous doped oxide on only the steep or substantially vertical sections of the substrate compared to the plane of the substrate surface. Normal re-oxidation is performed at block 711.

Figure 8:
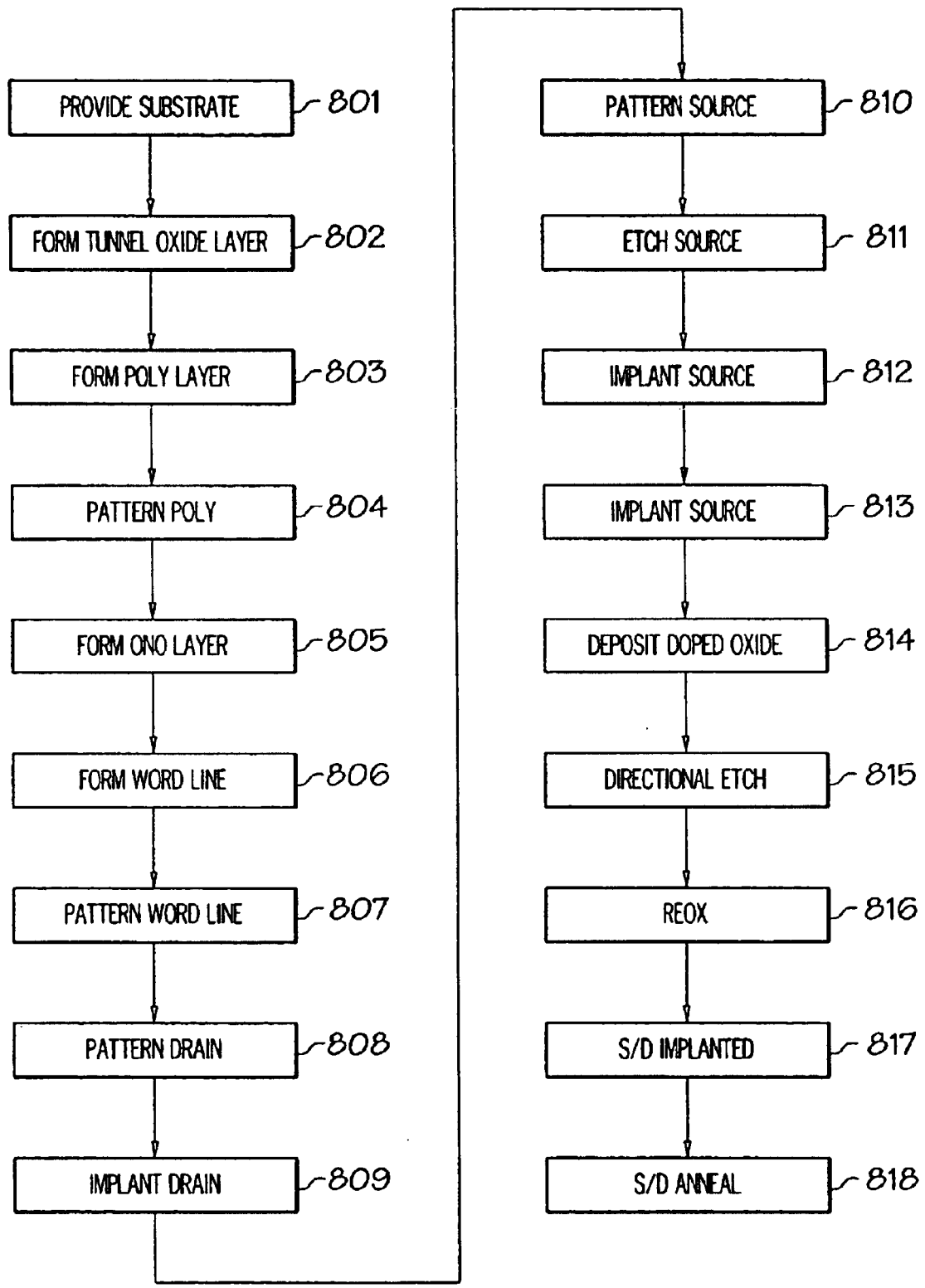
FIG. 8 illustrates a method according to one embodiment of the invention.

FIG. 8 illustrates a method of fabricating a memory cell according to one embodiment of the invention. The memory cell can be a flash, EPROM or EEPROM type memory cell. A substrate is provided at block 801. A tunnel oxide layer is formed over the substrate at block 802. The tunnel oxide layer can be deposited over the substrate. A floating gate polysilicon layer is formed over the tunnel oxide layer at block 803. The floating gate polysilicon layer is then patterned and etched at block 804. An ONO layer is formed over the floating gate polysilicon layer at block 805. A wordline polysilicon layer is formed over the ONO layer at block 806. The wordline polysilicon layer is then patterned and etched at block 807. The drain is patterned and etched at block 808. The drain is implanted with Boron at block 809. The source is patterned at block 810. The source is then etched at block 811. The source is implanted with phosphor at block 812. The source is implanted with arsenic at block 813. Phosphor doped oxide is deposited over the polysilicon layer at block 814. The thickness of the phosphorous-doped oxide and the phosphor concentration of the phosphorous-doped oxide are selected to achieve desired characteristics of the memory cell, such as program rate, erase rate and data retention. For illustrative purposes, some typical thickness and phosphor concentrations are 25 Å to 500 Å and 1% to 6%. A directional plasma etch is performed to remove phosphorous doped oxide from substantially horizontal surfaces at block 815. A source/drain reoxidation is performed at block 816. The source and drain are implanted with arsenic at block 817. A source and drain anneal is performed at block 818.

The resulting memory cell will likely have increased erase rates and programming rates compared to other conventional memory cells. Furthermore, the resulting memory cell can be fabricated according to more specific dimensions and parameters.

Figure 9:
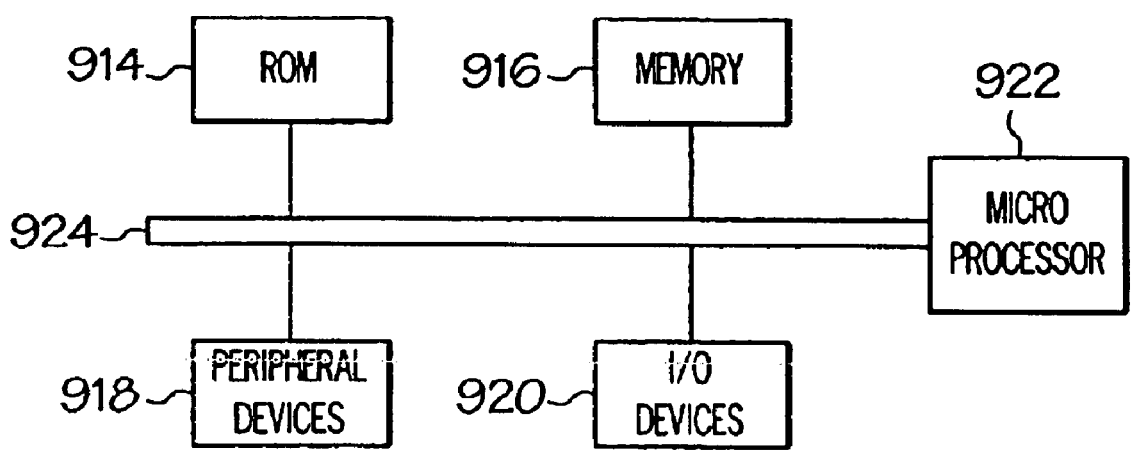
FIG. 9 is a computer system in with which embodiments of the invention may be used.

FIG. 9 is an illustration of a computer system 912 that can use and be used with embodiments of the present invention. As will be appreciated by those skilled in the art, the computer system 912 would include ROM 914, mass memory 916, peripheral devices 918, and I/O devices 920 in communication with a microprocessor 922 via a data bus 924 or another suitable data communication path. The memory devices 914 and 916 can be fabricated according to the various embodiments of the present invention. ROM 914 can include EPROM, EEPROM, or flash memory. Mass memory 916 can include DRAM, synchronous RAM or flash memory.

Many other electronic devices can be fabricated utilizing various embodiments of the present invention. For example, memory devices according to embodiments of the invention can be used in electronic devices such as cell phones, digital cameras, digital video cameras, digital audio players, cable television set top boxes, digital satellite receivers, personal digital assistants and the like.

Having described the invention in detail and by reference to preferred embodiments thereof, it will be apparent that modifications and variations are possible without departing from the scope of the invention defined in the appended claims. Other suitable materials may be substituted for those specifically recited herein. For example, the substrate may be composed of semiconductors such as gallium arsenide or germanium. Additionally, other dopants may be utilized besides those specifically stated. Generally, dopants are found in groups III and V of the periodic table.

What is claimed is:

1. A method for fabricating memory cells comprising:
   providing a substrate;
   forming a tunnel oxide layer over at least a portion of the substrate;
   forming a first polysilicon layer over at least a portion of the substrate;
   patterning the first polysilicon layer;
   forming a dielectric layer over at least a portion of the substrate;
   forming a second polysilicon layer over at least a portion of the substrate;
   patterning the second polysilicon layer;
   patterning one or more of the formed layers for a drain;
   implanting the drain with a first dopant;
   patterning one or more of the formed layers for a source;
   implanting the source with a second dopant;
   implanting the source with third dopant;
   depositing a phosphorous doped oxide layer having a thickness and a concentration over the substrate;
   selectively removing portions of the phosphorous doped oxide layer leaving substantially vertical portions of the phosphorous doped oxide layer in contact with the tunnel oxide layer, the first and second polysilicon layers, and the dielectric layer, and leaving substantially horizontal portions of the phosphorous doped oxide layer in contact with the substrate; and
   performing a source/drain reoxidation.

2. The method of claim 1, wherein selectively removing portions of the phosphorous doped oxide layer utilizes an anisotropic etch.

3. The method of claim 1, wherein the substantially vertical portions are sidewalls of the memory cells.

4. The method of claim 1, wherein the memory cells utilize shallow trench isolation.

5. The method of claim 1, wherein the first polysilicon layer is a floating gate.

6. The method of claim 1, wherein the dialectic layer is an oxide-nitride-oxide.

7. The method of claim 1, wherein the second polysilicon layer is a wordline.

8. The method of claim 1, wherein the elements are performed in-order.

9. The method of claim 1, wherein individually said first dopant, said second dopant, and said third dopant is a material selected from arsenic, boron, phosphor, an element from Group III and V of the periodic table, and combinations thereof.

10. The method of claim 1, wherein said thickness of said phosphorous doped oxide layer is from about 25 Å to about 500 Å.

11. The method of claim 1, wherein said concentration is a phosphorous concentration from about 1% to about 6%.

12. The method of claim 1, wherein said substrate is selected from silicon, gallium arsenide, germanium, and combination thereof.

13. The method of claim 1, wherein said dielectric layer is formed over at least said first poly layer.

14. The method of claim 1, wherein said second polysilicon layer is formed over at least said dielectric layer.

15. The method of claim 1, wherein said second polysilicon layer includes a metal silicide.

16. The method of claim 1, wherein said depositing said phosphorous doped oxide layer is by chemical vapor deposition or spin on glass.

17. The method of claim 1, wherein the first dopant is boron, the second dopant is phosphor, and the third dopant is arsenic.

18. The method of claim 1, further comprising implanting said source and drain with a fourth dopant.

19. The method of claim 18, further comprising performing a source/drain anneal.

20. The method of claim 18, wherein individually said first dopant, said second dopant, said third dopant, and said fourth dopant is a material selected from arsenic, boron, phosphor, an element from Group III and V of the periodic table, and combinations thereof.

21. A method for fabricating memory cells comprising:
   providing a substrate;
   forming a tunnel oxide layer over at least a portion of the substrate;
   forming a first polysilicon layer over at least a portion of the tunnel oxide layer;
   patterning the first polysilicon layer;
   forming a dielectric layer over at least a portion of the first polysilicon layer;
   forming a second polysilicon layer over at least a portion of the dielectric layer;

patterning the second polysilicon layer;

patterning one or more of the formed layers for a drain;

implanting the drain with boron;

patterning one or more of the formed layers for a source;

implanting the source with phosphor;

implanting the source with arsenic;

depositing a phosphorous doped oxide layer having a thickness and a concentration over the substrate;

selectively removing portions of the phosphorous doped oxide layer leaving substantially vertical portions of the phosphorous doped oxide layer in contact with the tunnel oxide layer, the first and second polysilicon layers, and the dielectric layer, and leaving substantially horizontal portions of the phosphorous doped oxide layer in contact with the substrate;

performing a source/drain reoxidation;

implanting the source and the drain with arsenic; and performing a source/drain anneal.

22. The method of claim 21, wherein selectively removing portions of the phosphorous doped oxide layer utilizes an anisotropic etch.

23. The method of claim 21, wherein the substantially vertical portions are sidewall of the memory cells.

24. The method of claim 21, wherein the memory cells utilize shallow trench isolation.

25. The method of claim 21, wherein the first polysilicon layer is a floating gate.

26. The method of claim 21, wherein the dielectric layer is an oxide-nitride-oxide.

27. The method of claim 21, wherein the second polysilicon layer is a wordline.

28. The method of claim 21, wherein the elements are performed in-order.

29. The method of claim 21, wherein said substrate is selected from silicon, gallium arsenide, germanium, and combination thereof.

30. The method of claim 21, wherein said dielectric layer is formed over at least said first poly layer.

31. The method of claim 21, wherein said second polysilicon layer is formed over at least said dielectric layer.

32. The method of claim 21, wherein said second polysilicon layer includes a metal silicide.

33. The method of claim 21, wherein said depositing said phosphorous doped oxide layer is by chemical vapor deposition or spin on glass.

34. The method of claim 21, wherein said thickness of said phosphorous doped oxide layer is from about 25 Å to about 500 Å.

35. The method of claim 21, wherein said concentration is a phosphorous concentration from about 1% to about 6%.

* * * * *